United States Patent
Ying et al.

(10) Patent No.: US 10,587,258 B2
(45) Date of Patent: Mar. 10, 2020

(54) DRIVE CIRCUIT OF POWER SEMICONDUCTOR SWITCH

(71) Applicant: Delta Electronics, Inc., Taoyuan, Taiwan (CN)

(72) Inventors: Jianping Ying, Taoyuan (CN); Ming Wang, Taoyuan (CN); Xiaobo Huang, Taoyuan (CN); Jun Liu, Taoyuan (CN); Zhiming Hu, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 0 days.

(21) Appl. No.: 16/445,483

(22) Filed: Jun. 19, 2019

(65) Prior Publication Data

US 2019/0386651 A1    Dec. 19, 2019

(30) Foreign Application Priority Data

Jun. 19, 2018    (CN) .......................... 2018 1 0631947

(51) Int. Cl.
    *H03K 17/082*     (2006.01)
    *H03K 17/61*     (2006.01)
    *H03K 17/567*     (2006.01)

(52) U.S. Cl.
    CPC ....... *H03K 17/0828* (2013.01); *H03K 17/567* (2013.01); *H03K 17/61* (2013.01)

(58) Field of Classification Search
None
See application file for complete search history.

(56) References Cited

U.S. PATENT DOCUMENTS

| | | | | |
|---|---|---|---|---|
| 5,923,547 A | * | 7/1999 | Mao ........................ | H02M 1/34 363/132 |
| 6,674,656 B1 | * | 1/2004 | Yang ................. | H02M 3/33523 363/21.1 |

(Continued)

FOREIGN PATENT DOCUMENTS

| CN | 100574102 C | 12/2009 |
|---|---|---|
| CN | 102185466 B | 3/2013 |

(Continued)

OTHER PUBLICATIONS

TW1OA for TW application No. 107132100 dated on Jan. 22, 2019.
The EESR issued Oct. 21, 2019 by the EPO.

*Primary Examiner* — Jeffery S Zweizig
(74) *Attorney, Agent, or Firm* — Yunling Ren

(57) ABSTRACT

A drive circuit of a power semiconductor switch includes: a pulse modulation circuit having a first terminal configured to receive a fault signal, an isolation transformer, and a pulse demodulation circuit; when there is no fault signal being received, the pulse modulation circuit outputs a first turn on pulse signal and a first turn off pulse signal via the isolation transformer and the pulse demodulation circuit to charge/discharge a gate capacitor of the power semiconductor switch, so as to drive the power semiconductor switch to be turned on and turned off at a first speed; when the fault signal is received, the pulse modulation circuit outputs a second turn off pulse signal via the isolation transformer and the pulse demodulation circuit to discharge the gate capacitor of the power semiconductor switch, so as to drive the power semiconductor switch to be turned off at a second speed.

17 Claims, 18 Drawing Sheets

(56) References Cited

U.S. PATENT DOCUMENTS

| | | |
|---|---|---|
| 6,851,077 B2 | 2/2005 | Herzer et al. |
| 8,466,734 B2 | 6/2013 | Mori |
| 9,131,568 B2 | 9/2015 | Kunimatsu |
| 10,312,816 B1 * | 6/2019 | Zhao ................ H02M 3/33507 |
| 2003/0085750 A1 | 5/2003 | Herzer et al. |
| 2010/0315842 A1 | 12/2010 | Nakanishi |

FOREIGN PATENT DOCUMENTS

| | | |
|---|---|---|
| CN | 202840920 U | 3/2013 |
| CN | 202888814 U | 4/2013 |
| CN | 203071568 U | 7/2013 |
| CN | 102315763 B | 9/2013 |
| CN | 107395184 A | 11/2017 |
| EP | 2961068 A1 | 12/2015 |
| TW | 201820756 A | 6/2018 |

* cited by examiner

DRIVE CIRCUIT OF POWER SEMICONDUCTOR SWITCH

CROSS REFERENCE

This application is based upon and claims priority to Chinese Patent Application No. 201810631947.0, filed on Jun. 19, 2018, the entire contents thereof are incorporated herein by reference.

TECHNICAL FIELD

The present disclosure relates to the field of power electronic conversion technologies, and more particularly, to a drive circuit of a power semiconductor switch.

BACKGROUND

More and more high-power switching devices such as an IGBT (insulated gate bipolar transistor) module are used in power electronic equipment. Reliable operation of the IGBT is critical to proper functioning of power electronic systems. When the IGBT module shorts, the current flowing through the IGBT module is large, and thus the power loss of the IGBT module is large. Consequently, the IGBT module may likely be thermally broken down if no protection is quickly taken.

When the IGBT shorts occurs, the IGBT is turned off too quickly, a stray inductance exists on a busbar connected to the IGBT module, larger di/dt may generate a larger spike voltage, which may damage the IGBT module. In the application of high-power IGBT modules, soft turn off circuits or active clamping circuits are used. When the IGBTs need to be turned off in the event of overcurrent/short-circuit fault, the soft turn off circuits or the active clamping circuits can better suppress the spike voltage and can effectively protect the IGBT modules. For the occasion where a simple drive is used, due to particularities of the simple drive, the traditional soft turn off circuits or active clamping circuits are not applicable any more, and thus it is required to find new solutions.

Principles of "the simple drive" are as follows.

As shown in FIG. 1, a schematic block diagram of a traditional drive is illustrated. In FIG. 1, in the traditional drive, an energy pulse signal and a drive pulse signal are separately transmitted, Wherein the energy pulse signal contains power supply information, and the drive pulse signal contains drive information. That is, the energy pulse signal is transmitted from a control board to a drive board through an isolation transformer, and then is generated into a stable drive power supply by means of relevant circuits. Whereas the drive pulse signal is transmitted from the control board to the drive board through another isolation transformer, and then is generated into a drive signal containing positive and negative voltages by means of the above generated drive power supply and a demodulation circuit to drive the IGBT to be turned on or turned off, wherein the drive power supply is used to supply power to the demodulation circuit.

As shown in FIG. 2, a schematic block diagram of a simple drive is illustrated. In FIG. 2, a control board outputs both an energy pulse signal and a drive pulse signal. After being transmitted through an isolation transformer, the energy pulse signal and the drive pulse signal charge/discharge a gate capacitor of the IGBT via a drive board to finally form a drive signal to drive the IGBT to be turned on or turned off Because circuits related to energy transmission are omitted, devices used in the simple drive are greatly reduced, such that the entire drive circuit is greatly simplified, power consumption is reduced, and reliability is improved.

In the simple drive circuit, the control board modulates a pulse width modulation (PWM) signal into a pulse signal $V_{winding}$, which includes both an energy pulse signal and a drive pulse signal. The pulse signal is transmitted to the drive board through the isolation transformer, as shown in $V_{winding}$ in FIG. 3. The signal triggers a relevant switch tube in the control board to act and then charges/discharges the gate capacitor of the IGBT to finally form a gate voltage, as shown in $V_{GE}$ in FIG. 3. The $V_{GE}$ is formed by charging or discharging the gate capacitor by the pulse signal. Reference is made by taking an example where the $V_{GE}$ is positive. To reduce a magnetic core of the isolation transformer and ensure the magnetic core to be unsaturated, the pulse width of the pulse signal may be only a few microseconds, and the pulse signal can charge the gate capacitor to a $V_{GE}$ value (+15V) required to drive the IGBT. However, the pulse width of a real drive signal may be tens or hundreds of microseconds or even longer. If there is no refresh pulse signal, the gate capacitor may slowly discharge, causing the $V_{GE}$ to gradually decrease, such that a normal drive voltage cannot be reached. Therefore, the refresh pulse needs to charge the gate capacitor at intervals to maintain the gate voltage $V_{GE}$. As for the time interval of the refresh pulse, it is mainly determined by a gate capacitor discharge time constant. In principle, the $V_{GE}$ does not drop too much before arrival of a next refresh pulse (for example, the $V_{GE}$ should not be lower than 14V before arrival of the next refresh pulse).

According to principles of the simple drive, the simple drive has no stable drive power supply. Therefore, traditional soft turn off circuits are no longer applicable. This is because there is no stable power supply to control the switch tube of the drive board, and thus it is impossible to switch a large resistor or a large capacitor after a fault signal is detected.

For the active clamping circuits, in some applications, a bus voltage may gradually rise. When the bus voltage exceeds a clamping value, transient voltage suppressors (TVS) may be broken down, and the active clamping circuits may continuously inject charges into the gate. Because there is no stable negative power supply, the gate voltage may likely be elevated above a threshold, which is prone to a fault of bridge arm direct connection.

Therefore, for application of the simple drive, a new drive circuit of a power semiconductor switch is needed.

The above-mentioned information disclosed in this Background section is only for the purpose of enhancing the understanding of background of the present disclosure and may therefore include information that does not constitute a prior art that is known to those of ordinary skill in the art.

SUMMARY

The present disclosure provides a drive circuit of a power semiconductor switch to overcome, at least to a certain extent, one or more problems caused by limitations and defects of related technologies.

Other features and advantages of the present disclosure will become apparent from the following detailed description, or will be obtained in part, by practice of the present disclosure.

According to an exemplary embodiment of the present disclosure, a drive circuit of a power semiconductor switch is disclosed, which includes:

a pulse modulation circuit, including a first terminal, a second terminal and a third terminal, the first terminal being configured to receive a fault signal;

an isolation transformer, including a first primary terminal, a second primary terminal, a first secondary terminal, and a second secondary terminal; the first primary terminal being coupled to the second terminal of the pulse modulation circuit, and the second primary terminal being coupled to the third terminal of the pulse modulation circuit; and a pulse demodulation circuit, including a first input terminal, a second input terminal, a first output terminal, and a second output terminal; the first input terminal being coupled to the first secondary terminal, the second input terminal being coupled to the second secondary terminal, the first output terminal being connected to a gate of the power semiconductor switch, and the second output terminal being connected to an emitter of the power semiconductor switch.

When the first terminal of the pulse modulation circuit does not receive the fault signal, the pulse modulation circuit outputs at least one first turn on pulse signal and at least one first turn off pulse signal to the isolation transformer based on a pulse width modulation signal, transmits the at least one first turn on pulse signal and the at least one first turn off pulse signal to the pulse demodulation circuit via, the isolation transformer, and charges/discharges a gate capacitor of the power semiconductor switch via the demodulation circuit based on the at least one first turn on pulse signal and the at least one first turn off pulse signal to drive the power semiconductor switch to be turned on and turned off at a first speed.

Then the first terminal of the pulse modulation circuit receives the fault signal, the pulse modulation circuit outputs at least one second turn off pulse signal to the isolation transformer based on the fault signal, transmits the at least one second turn off pulse signal to the pulse demodulation circuit via the isolation transformer, and discharges the gate capacitor of the power semiconductor switch via the pulse demodulation circuit based on the at least one second turn off pulse signal to drive the power semiconductor switch to be turned off at a second speed. A voltage amplitude of a preset pulse width in each of the second turn off pulse signals is smaller than a voltage amplitude of each of the first turn off pulse signals, and a pulse width of each of the second turn off pulse signals is equal to that of each of the first turn off pulse signals, causing the second speed to be smaller than the first speed.

According to an exemplary embodiment of the present disclosure, the pulse modulation circuit includes a first pulse source having a first terminal and a second terminal, a second pulse source having a first terminal and a second terminal, and a normally-closed switch. The normally-closed switch is connected in parallel to the first terminal and the second terminal of the second pulse source. A control terminal of the normally-closed switch is coupled to the first terminal of the pulse modulation circuit. The first terminal of the second pulse source is connected to the first terminal of the first pulse source, the second terminal of the second pulse source is connected to the second terminal of the pulse modulation circuit, and the second terminal of the first pulse source is connected to the third terminal of the pulse modulation circuit.

According to an exemplary embodiment of the present disclosure, the first pulse source includes a first switch, a second switch, a third switch, and a fourth switch. Each switch includes a first terminal and a second terminal. The second terminal of the first switch and the first terminal of the second switch are electrically connected to the first terminal of the first pulse source. The second terminal of the third switch and the first terminal of the fourth switch are electrically connected to the second terminal of the first pulse source. The first terminal of the first switch and the first terminal of the third switch are electrically connected to a working power supply. The second terminal of the second switch and the second terminal of the fourth switch are grounded.

The second pulse source is a winding, wherein a first terminal and a second terminal of the winding are respectively connected to the first terminal and the second terminal of the second pulse source.

According to an exemplary embodiment of the present disclosure, when the first terminal of the pulse modulation circuit does not receive the fault signal, the normally-closed switch is closed, and the first switch and the fourth switch are turned on and the second switch and the third switch are turned off, such that the first pulse source outputs the at least one first turn on pulse signal; or the first switch and the fourth switch are turned off and the second switch and the third switch are turned on, such that the first pulse source outputs the at least one first turn off pulse signal.

When the first terminal of the pulse modulation circuit receives the fault signal, the normally-closed switch is turned off, and the first switch and the fourth switch are turned off and the second switch and the third switch are turned on, such that the first pulse source and the second pulse source jointly output the at least one second turn off pulse signal.

According to an exemplary embodiment of the present disclosure, the first pulse source includes a first capacitor, a second capacitor, a first switch, and a second switch. A second terminal of the first capacitor and a first terminal of the second capacitor are electrically connected to the first terminal of the first pulse source. A second terminal of the first switch and a first terminal of the second switch are electrically connected to the second terminal of the first pulse source. A first terminal of the first capacitor and a first terminal of the first switch are electrically connected to a working power supply. A second terminal of the second capacitor and a second terminal of the second switch are grounded.

The second pulse source is a winding, wherein a first terminal and a second terminal of the winding are respectively connected to the first terminal and the second terminal of the second pulse source.

According to an exemplary embodiment of the present disclosure, when the first terminal of the pulse modulation circuit does not receive the fault signal, the normally-closed switch is closed, and the second switch is turned on and the first switch is turned off, such that the first pulse source outputs the at least one first turn on pulse signal; or the first switch is turned on and the second switch is turned off, such that the first pulse source outputs the at least one first turn off pulse signal.

When the first terminal of the pulse modulation circuit receives the fault signal, the normally-closed switch is turned off, and the first switch is turned on and the second switch is turned off, such that the first pulse source and the second pulse source jointly output the at least one second turn off pulse signal.

According to an exemplary embodiment of the present disclosure, the pulse modulation circuit includes a first switch, a second switch, a third switch, a fourth switch, a fifth switch, and a stabilivolt. Each switch includes a first terminal and a second terminal. The second terminal of the first switch and the first terminal of the second switch are electrically connected to the second terminal of the pulse modulation circuit. The second terminal of the third switch and the first terminal of the fourth switch are electrically connected to the third terminal of the pulse modulation circuit. The first terminal of the first switch and the first terminal of the third switch are electrically connected to a working power supply. The second terminal of the second switch and the second terminal of the fourth switch are grounded. A control terminal of the second switch is coupled to the first terminal of the pulse modulation circuit.

A cathode of the stabilivolt is connected to the second terminal of the first switch, an anode of the stabilivolt is connected to the first terminal of the fifth switch, and the second terminal of the fifth switch is grounded.

According to an exemplary embodiment of the present disclosure, when the first terminal of the pulse modulation circuit does not receive the fault signal, the first switch and the fourth switch are turned on and the second switch, the third switch and the fifth switch are turned off, such that the pulse modulation circuit outputs the at least one first turn on pulse signal; or the first switch and the fourth switch are turned off and the second switch, the third switch and the fifth switch are turned on, such that the pulse modulation circuit outputs the at least one first turn off pulse signal.

When the first terminal of the pulse modulation circuit receives the fault signal, the first switch, the second switch and the fourth switch are turned off and the third switch and the fifth switch are turned on, such that the pulse modulation circuit outputs the at least one second turn off pulse signal.

According to an exemplary embodiment of the present disclosure, the pulse modulation circuit includes a first capacitor, a second capacitor, a third capacitor, a first switch, a second switch, and a normally-closed switch. A second terminal of the first capacitor is electrically connected to a first terminal of the second capacitor. A second terminal of the second capacitor and a first terminal of the third capacitor are electrically connected to the second terminal of the pulse modulation circuit. A second terminal of the first switch and a first terminal of the second switch are electrically connected to the third terminal of the pulse modulation circuit. A first terminal of the first capacitor and a first terminal of the first switch are electrically connected to a working power supply. A second terminal of the third capacitor and a second terminal of the second switch are grounded. The normally-closed switch is connected in parallel to the first terminal and the second terminal of the first capacitor, and a control terminal of the normally-closed switch is coupled to the first terminal of the pulse modulation circuit.

According to an exemplary embodiment of the present disclosure, when the first terminal of the pulse modulation circuit does not receive the fault signal, the normally-closed switch is closed, and the second switch is turned on and the first switch is turned off, such that the pulse modulation circuit outputs the at least one first turn on pulse signal; or the second switch is turned off and the first switch is turned on, such that the pulse modulation circuit outputs the at least one first turn off pulse signal.

When the first terminal of the pulse modulation circuit receives the fault signal, the normally-closed switch is turned off, and the first switch is turned on and the second switch is turned off, such that the pulse modulation circuit outputs the at least one second turn off pulse signal.

According to an exemplary embodiment of the present disclosure, the pulse modulation circuit further includes a time control unit. The time control unit is coupled between the control terminal of the normally-closed switch and the first terminal of the pulse modulation circuit. The time control unit is configured to control, based on the fault signal received by the first terminal of the pulse modulation circuit, the normally-closed switch to be turned off within a preset time period.

According to an exemplary embodiment of the present disclosure, the pulse modulation circuit further includes a time control unit. The time control unit is coupled between the control terminal of the second switch and the first terminal of the pulse modulation circuit. The time control unit is configured to control, based on the fault signal received by the first terminal of the pulse modulation circuit, the second switch to be turned off within a preset time period.

According to an exemplary embodiment of the present disclosure, the pulse modulation circuit further includes a time control unit. The time control unit is coupled between the control terminal of the normally-closed switch and the first terminal of the pulse modulation circuit. The time control unit is configured to control, based on the fault signal received by the first terminal of the pulse modulation circuit, the normally-closed switch to be turned off within a preset time period.

According to an exemplary embodiment of the present disclosure, the preset time period is a pulse width of the second turn off pulse signal.

According to an exemplary embodiment of the present disclosure, the preset time period is less than a pulse width of the second turn off pulse signal and falls within a first part of the second turn off pulse signal.

According to an exemplary embodiment of the present disclosure, the preset time period is less than a pulse width of the second turn off pulse signal and falls within a middle part of the second turn off pulse signal.

According to an exemplary embodiment of the present disclosure, the preset pulse width is equal to the preset time period.

According to an exemplary embodiment of the present disclosure, the first turn on pulse signal, the first turn off pulse signal and the second turn off pulse signal include an energy pulse signal and a drive pulse signal.

According to some embodiments of the present disclosure, by means of a simple circuit structure, the drive circuit of the power semiconductor switch solves a problem that a simple drive is not suitable to apply in traditional soft turn off circuit and active clamping circuit. Therefore, voltage spike when the IGBT is turned off in the event of overcurrent/short-circuit fault may be effectively reduced, and reliability and scope of application of the simple drive may be greatly enhanced.

According to some embodiments of the present disclosure, the drive circuit of the power semiconductor switch of the present disclosure is simple in structure, low in cost, and high in reliability.

According to some embodiments of the present disclosure, by sequentially processing the fault signal F and then controlling the normally-closed switch SW or other switches, the volt-second value of the second turn off pulse signal may be flexibly adjusted, and the turn off effect of the power semiconductor switch may be regulated.

It is to be understood that both the foregoing general description and the following detailed description are exemplary and explanatory only and are not restrictive of the present disclosure.

BRIEF DESCRIPTION OF THE DRAWINGS

The above and other objectives, features and advantages of the present disclosure will become more apparent by describing in detail the exemplary embodiments thereof with reference to the accompanying drawings, in which.

DETAILED DESCRIPTION

Figure 1:
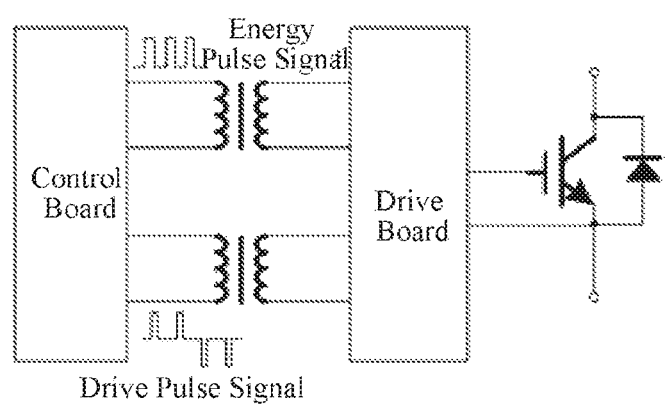
FIG. 1 illustrates a schematic block diagram of a traditional drive circuit.
Figure 2:
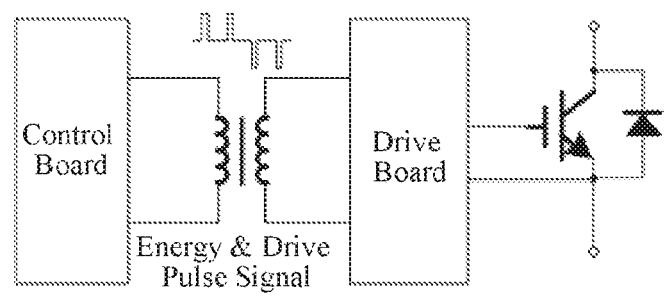
FIG. 2 illustrates a schematic block diagram of a simple drive circuit.
Figure 3:
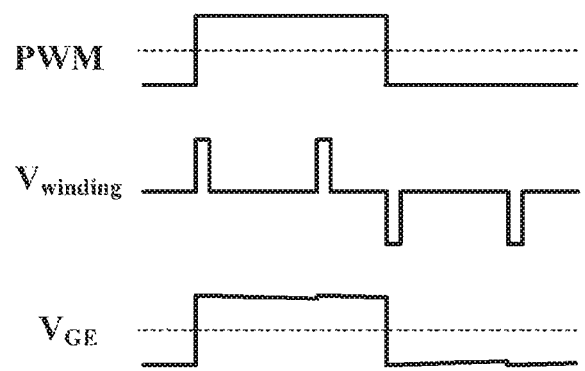
FIG. 3 illustrates a waveform diagram of a simple drive circuit.

Exemplary embodiments will be described more comprehensively by referring to accompanying drawings now. However, these exemplary embodiments can be implemented in a variety of forms and should not be construed as limited to the examples set forth herein. Rather, these embodiments are provided so that description of the present disclosure will be more thorough and complete and will fully convey the concepts of exemplary embodiments to those skilled in the art. The accompanying drawings are merely exemplary illustration of the present disclosure, and are not necessarily drawn to scale.

Moreover, "coupled to" as used herein may mean that two or more elements are either in direct physical or electrical contact or in indirect physical or electrical contact, or may mean that two or more elements co-operate or interact with each other.

Furthermore, the described features, structures, or characteristics may be combined in any suitable manner in one or more embodiments. Many concrete details are provided in the following descriptions for a full understanding of the embodiments of the present disclosure. However, those skilled in the art will appreciate that the technical solutions in the present disclosure may be practiced without one or more of the specific details, or that other methods, elements, steps and so on may be employed. In other instances, well-known structures, methods, implementations or operations are not shown or described in detail to avoid obscuring aspects of the present disclosure.

Some block diagrams shown in the figures are functional entities and not necessarily to be corresponding to a physically or logically individual entities. These functional entities may be implemented in one or more hardware modules or integrated circuits, or implemented in different networks and/or processor apparatuses and/or microcontroller apparatuses.

An objective of the present disclosure is to disclose a drive circuit of a power semiconductor switch. The drive circuit and the power semiconductor switch are used in a power conversion system. The drive circuit includes: a pulse modulation circuit, including a first terminal, a second terminal and a third terminal, wherein the first terminal is configured to receive a fault signal; an isolation transformer, including a first primary terminal, a second primary terminal, a first secondary terminal, and a second secondary terminal, wherein the first primary terminal is coupled to the second terminal of the pulse modulation circuit, and the second primary terminal is coupled to the third terminal of the pulse modulation circuit; and a pulse demodulation circuit, including a first input terminal, a second input terminal, a first output terminal, and a second output terminal. The first input terminal is coupled to the first secondary terminal, the second input terminal is coupled to the second secondary terminal, the first output terminal is connected to a gate of the power semiconductor switch (such as IGBT or MOSFET), and the second output terminal is connected to an emitter of the power semiconductor switch. When the first terminal of the pulse modulation circuit does not receive the fault signal, the pulse modulation circuit outputs at least one first turn on pulse signal and at least one first turn off pulse signal to the isolation transformer based on a pulse width modulation signal, transmits the at least one first turn on pulse signal and the at least one first turn off pulse signal to the pulse demodulation circuit via the isolation transformer, and charges/discharges a gate capacitor of the power semiconductor switch via the demodulation circuit based on the at least one first turn on pulse signal and the at least one first turn off pulse signal to drive the power semiconductor switch to be turned on and turned off at a first speed. In this embodiment, the number of the at least one first turn on pulse signal is multiple, the pulse width of the first turn on pulse signal may be only a few microseconds, the first turn on pulse signal can charge the gate capacitor of the power semiconductor switch to the required drive voltage, then the gate capacitor may slowly discharge, and thus the voltage of the gate capacitor may gradually drop. Therefore, the power semiconductor switch needs to be maintained on for a certain period of time, and a plurality of first turn on pulse signals are required, wherein the number of the first turn on pulse signals is determined by duration of the power semiconductor switch maintained on and a discharge time constant of the gate capacitor, and the discharge time constant of the gate capacitor determines refresh time between two adjacent first turn on pulse signals. The number of the at least one first turn off pulse signal may be one or more, and the pulse width of the first turn off pulse signal may be only a few microseconds, and the first turn off pulse signal may discharge the gate capacitor of the power semiconductor switch, such that the power semiconductor switch is in a turned off state. When the number of the first turn off pulse signals is multiple, refresh time exists between two adjacent first turn off pulse signals.

When the first terminal of the pulse modulation circuit receives the fault signal, the pulse modulation circuit outputs at least one second turn off pulse signal to the isolation transformer based on the fault signal, transmits the at least one second turn off pulse signal to the pulse demodulation circuit via the isolation transformer, and discharges the gate of the power semiconductor switch via the pulse demodulation circuit to drive the power semiconductor switch to be turned off at a second speed. A voltage amplitude of a preset pulse width in each of the second turn off pulse signals is smaller than that of each of the first turn off pulse signals, and a pulse width of each of the first turn off pulse signals is equal to that of each of the second turn off pulse signals, causing the second speed to be smaller than the first speed.

In this embodiment, the first turn on pulse signal, the first turn off pulse signal and the second turn off pulse signal include an energy pulse signal and a drive pulse signal.

By means of a simple circuit structure, the drive circuit of the power semiconductor switch solves the problem that the simple drive is not suitable to apply in traditional soft turn off circuit and active clamping circuit. Therefore, voltage spike triggered by large current when the IGBT is turned off in the event of overcurrent/short-circuit fault may be effectively reduced, and reliability and scope of application of the simple drive may be greatly enhanced. Furthermore, the drive circuit of the power semiconductor switch of the present disclosure is simple in structure, low in cost, and high in reliability. Moreover, by sequentially processing the fault signal F and then controlling the normally-closed switch SW or other switches, the volt-second value of the second turn off pulse signal may be flexibly adjusted, and the turn off effect of the power semiconductor switch may be regulated.

Figure 4:
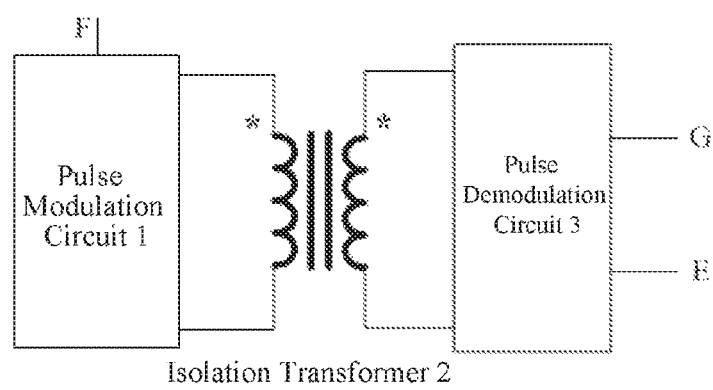
FIG. 4 illustrates a schematic diagram of a drive circuit of a power semiconductor switch according to the present disclosure.
Figure 5:
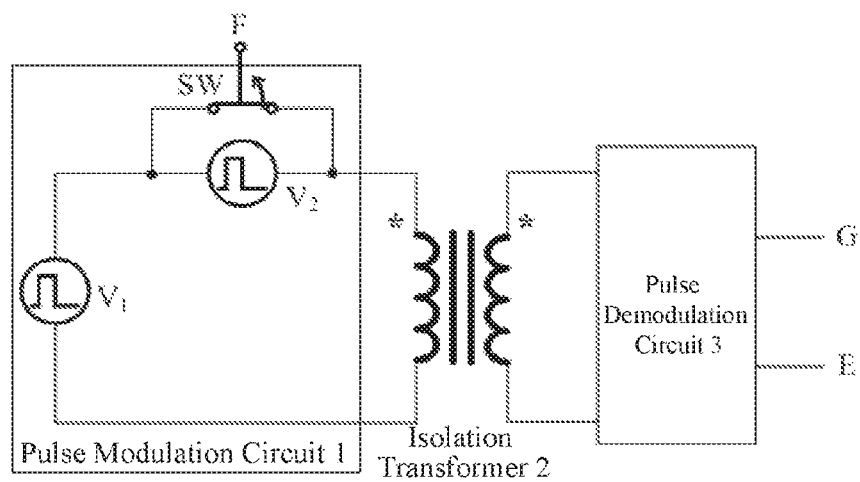
FIG. 5 illustrates a circuit diagram of a drive circuit of a power semiconductor switch according to a first exemplary embodiment of the present disclosure.
Figure 6:
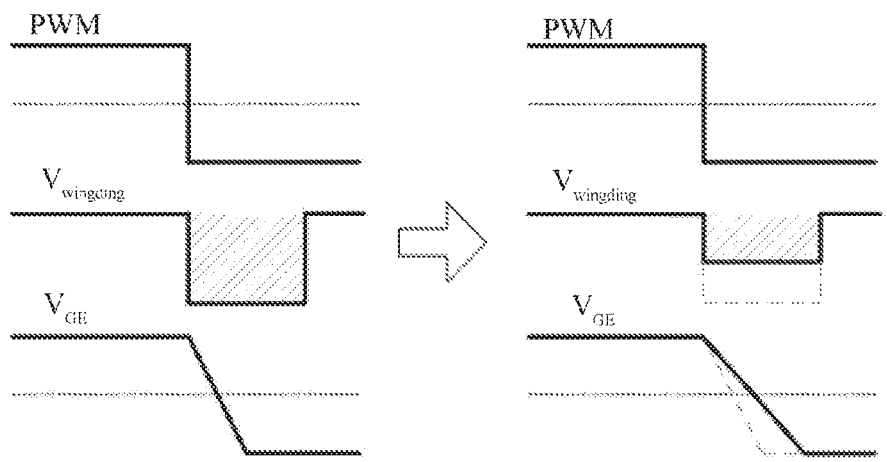
FIG. 6 illustrates a waveform diagram of the drive circuit of the power semiconductor switch according to the first exemplary embodiment of the present disclosure.
Figure 7:
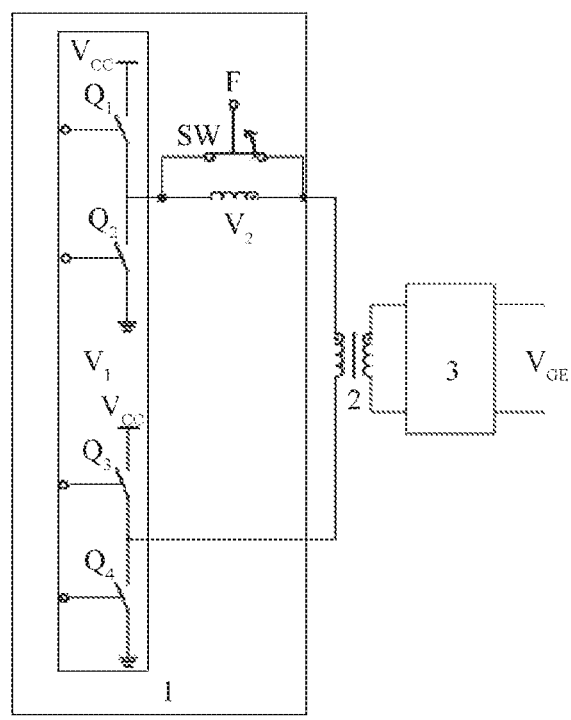
FIG. 7 illustrates a circuit diagram of the drive circuit of the power semiconductor switch according to a first specific example of the first exemplary embodiment of the present disclosure.
Figure 8:
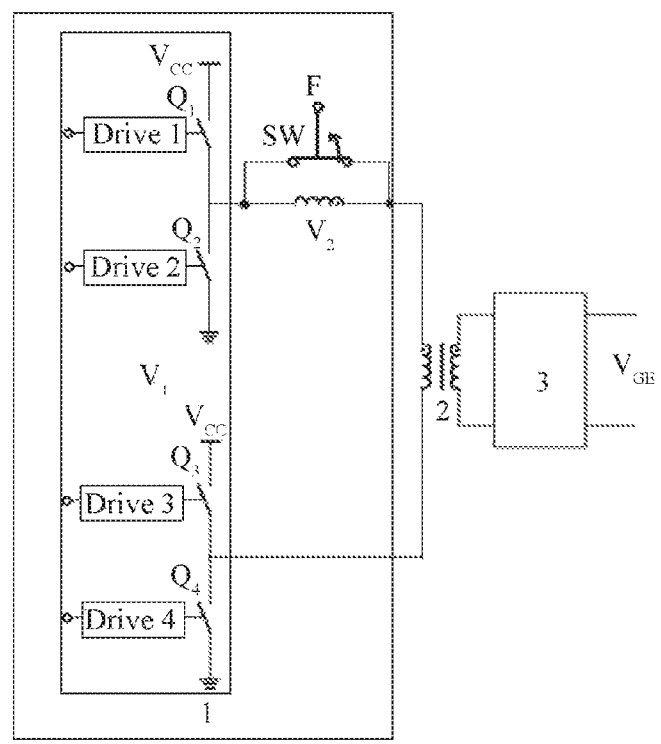
FIG. 8 illustrates a circuit diagram of the drive circuit of the power semiconductor switch according to a modified example of the first specific example of the first exemplary embodiment of the present disclosure.
Figure 9:
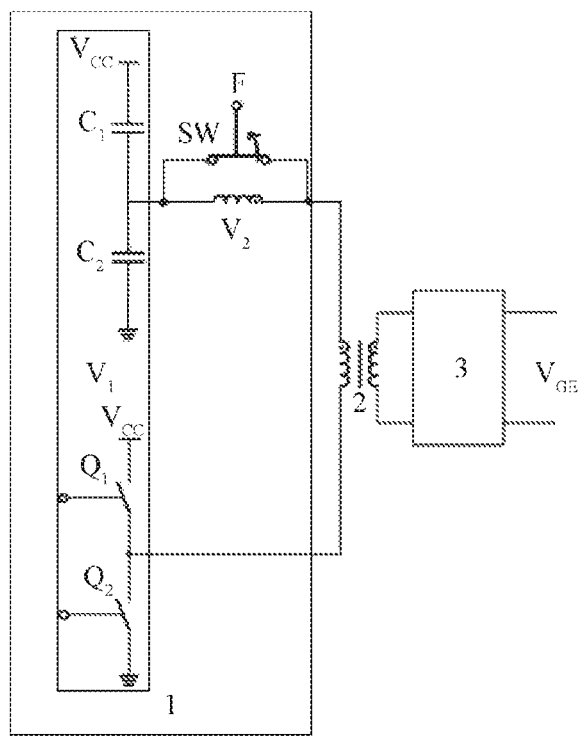
FIG. 9 illustrates a circuit diagram of the drive circuit of the power semiconductor switch according to a second specific example of the first exemplary embodiment of the present disclosure.
Figure 10:
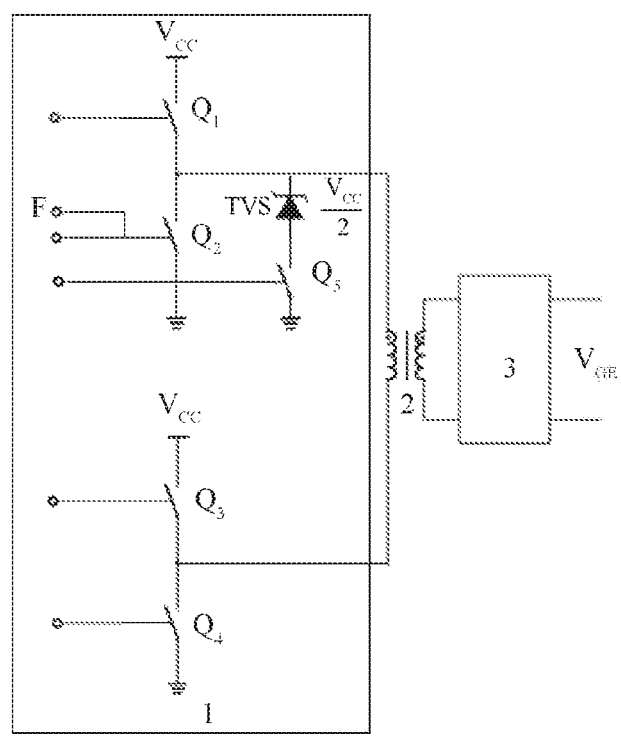
FIG. 10 illustrates a circuit diagram of a drive circuit of a power semiconductor switch according to a second exemplary embodiment of the present disclosure.
Figure 11:
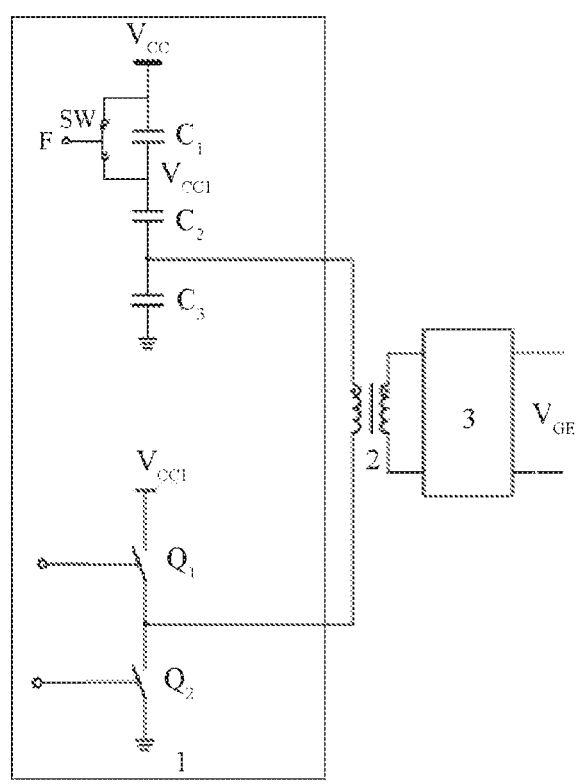
FIG. 11 illustrates a circuit diagram of a drive circuit of a power semiconductor switch according to a third exemplary embodiment of the present disclosure.
Figure 12:
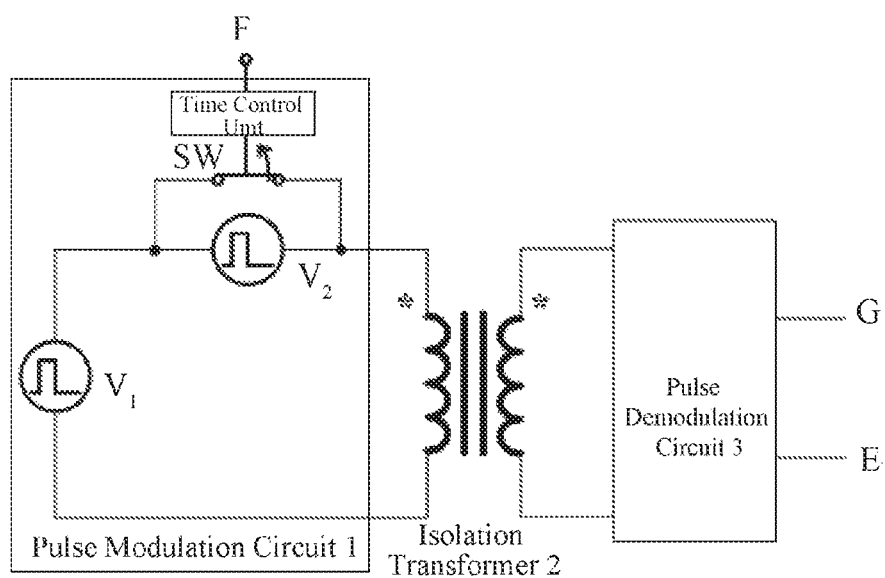
FIG. 12 illustrates a circuit diagram of the drive circuit of the power semiconductor switch according to a modified example of the first exemplary embodiment of the present disclosure.
Figure 13:
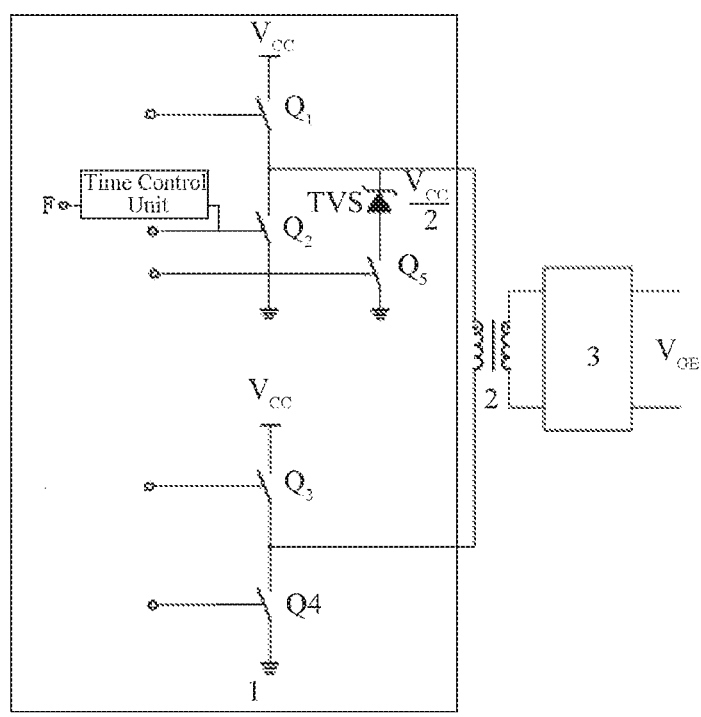
FIG. 13 illustrates a circuit diagram of the drive circuit of the power semiconductor switch according to a modified example of the second exemplary embodiment of the present disclosure.
Figure 14:
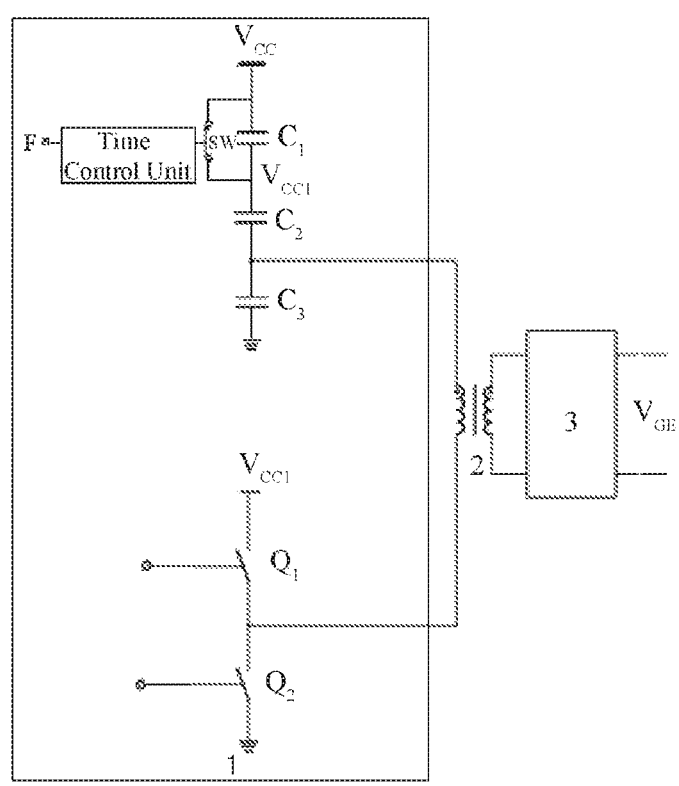
FIG. 14 illustrates a circuit diagram of the drive circuit of the power semiconductor switch according to a modified example of the third exemplary embodiment of the present disclosure.

The drive circuit of the power semiconductor switch of the present disclosure is described in detail below with reference to FIG. 4-FIG 15d, in which, FIG. 4 illustrates a schematic diagram of the drive circuit of the power semiconductor switch according to the present disclosure; FIG. 5 illustrates a circuit diagram of the drive circuit of the power semiconductor switch according to a first exemplary embodiment of the present disclosure; FIG. 6 illustrates a waveform diagram of the drive circuit of the power semiconductor switch according to the first exemplary embodiment of the present disclosure; FIG. 7 illustrates a circuit diagram of the drive circuit of the power semiconductor switch according to a first specific example of the first exemplary embodiment of the present disclosure; FIG. 8 illustrates a circuit diagram of the drive circuit of the power semiconductor switch according to a modified example of the first specific example of the first exemplary embodiment of the present disclosure; FIG. 9 illustrates a circuit diagram of the drive circuit of the power semiconductor switch according to a second specific example of the first exemplary embodiment of the present disclosure; FIG. 10 illustrates a circuit diagram of the drive circuit of the power semiconductor switch according to a second exemplary embodiment of the present disclosure; FIG. 11 illustrates a circuit diagram of the drive circuit of the power semiconductor switch according to a third exemplary embodiment of the present disclosure; FIG. 12 illustrates a circuit diagram f the drive circuit of the power semiconductor switch according to a modified example of the first exemplary embodiment of the present disclosure; FIG. 13 illustrates a circuit diagram of the drive circuit of the power semiconductor switch according to a modified example of the second exemplary embodiment of the present disclosure; FIG. 14 illustrates a circuit diagram of the drive circuit of the power semiconductor switch according to a modified example of the third exemplary embodiment of the present disclosure; and FIG. 15a-FIG 15d illustrate waveform diagrams of the drive circuit of the power semiconductor switch according to a modified example of the first exemplary embodiment of the present disclosure.

FIG. 4 illustrates a schematic diagram of the drive circuit of the power semiconductor switch according to the present disclosure. As shown in FIG. 4, the drive circuit of the power semiconductor switch includes: a pulse modulation circuit 1, including a first terminal, a second terminal and a third terminal, wherein the first terminal is configured to receive a fault signal F; an isolation transformer 2, including a first primary terminal, a second primary terminal, a first secondary terminal, and a second secondary terminal, wherein the first primary terminal is coupled to the second terminal of the pulse modulation circuit, and the second primary terminal is coupled to the third terminal of the pulse modulation circuit; and a pulse demodulation circuit 3, including a first input terminal, a second input terminal, a first output terminal, and a second output terminal. The first input terminal is coupled to the first secondary terminal, the second input terminal is coupled to the second secondary terminal, the first output terminal is connected to a gate G of the power semiconductor switch, and the second output terminal is connected to an emitter E of the power semiconductor switch. For example, the power semiconductor switch is an insulated gate bipolar transistor (IGBT), and the gate G and the emitter E of the power semiconductor switch is the gate and the emitter of the IGBT. When the first terminal of the pulse modulation circuit 1 does not receive the fault signal F, the pulse modulation circuit 1 outputs at least one first turn on pulse signal and at least one first turn off pulse signal to the isolation transformer based on a pulse width modulation (PWM) signal, and the isolation transformer transmits the at least one first turn on pulse signal and the at least one first turn off pulse signal to the pulse demodulation circuit, and charges/discharges a gate capacitor of the power semiconductor switch via the pulse demodulation circuit 3 based on the at least one first turn on pulse signal and the at least one first turn off pulse signal to finally form a drive signal $V_{GE}$ so as to drive the power semiconductor switch to be turned on and turned off at a first speed. In this embodiment, the pulse demodulation circuit 3 includes an associated switch tube. The at least one first turn on pulse signal and the at least one first turn off pulse signal may first trigger an action of the associated switch tube of the pulse demodulation circuit 3, and then charge/discharge the gate capacitor of the power semiconductor switch. When the first terminal of the pulse modulation circuit receives the fault signal F, the pulse modulation circuit outputs at least one second turn off pulse signal to the isolation transformer 2 based on the fault signal F, the isolation transformer 2 transmits the at least one second turn off pulse signal to the pulse demodulation circuit 3, and the pulse demodulation circuit 3 discharges the gate capacitor of the power semiconductor switch based on the at least one second turn off pulse signal to drive the power semiconductor switch to be turned off at a second speed. A voltage amplitude of a preset pulse width in each of the second turn off pulse signals is smaller than that of each of the first turn off pulse signals, and a pulse width of the first turn off pulse signal is equal to that of the second turn off pulse signal, causing the second speed to be smaller than the first speed. At this moment, a volt-second value of the second turn off pulse signal is smaller than that of the first turn off pulse signal, such that a gate turn off speed of the power semiconductor switch becomes smaller. That is, the second speed is smaller than the first speed to play a role of soft turn off so as to effectively protect the power semiconductor switch such as the IGBT.

FIG. 5 illustrates a circuit diagram of the drive circuit of the power semiconductor switch according to a first exemplary embodiment of the present disclosure.

According to the first exemplary embodiment of the present disclosure as shown in FIG. 5, the pulse modulation circuit 1 includes a first pulse source $V_1$ having a first terminal and a second terminal, a second pulse source $V_2$ having a first terminal and a second terminal, and a normally-closed switch SW. The normally-closed switch SW is connected in parallel to the first terminal and the second terminal of the second pulse source $V_2$. A control terminal of the normally-closed switch SW is connected to the first terminal of the pulse modulation circuit, i.e., the control terminal of the normally-closed switch is connected to the first terminal of the pulse modulation circuit 1. For example, the control terminal of the normally-closed switch SW is the first terminal of the pulse modulation circuit 1. The first terminal of the second pulse source $V_2$ is connected to the first terminal of the first pulse source $V_1$, and the second terminal of the second pulse source $V_2$ is connected to the second terminal of the pulse modulation circuit 1, i.e., the second terminal of the second pulse source is the second terminal of the pulse modulation circuit 1. The second terminal of the first pulse source $V_1$ is connected to the third terminal of the pulse modulation circuit 1, i.e., the second terminal of the first pulse source $V_1$ is the third terminal of the pulse modulation circuit 1. When the first terminal of the pulse modulation circuit 1 does not receive the fault signal F, i.e., when the power conversion system properly operates, the normally-closed switch SW is closed, and the second pulse source $V_2$ is bypassed by the normally-closed switch SW, such that the first pulse source $V_1$ outputs at least one first turn on pulse signal and at least one first turn off pulse signal. When the control terminal of the normally-closed switch SW receives the fault signal F, the normally-closed switch SW is turned off, such that the first pulse source $V_1$ and the second pulse source $V_2$ jointly output at least one second turn off pulse signal. At this moment, a volt-second value (i.e., slope of $V_{GE}$/descent speed) of the second turn off pulse signal is smaller than that of the first turn off pulse signal, causing a gate turn off speed of the power semiconductor switch to be smaller to play a role of soft turn off, as shown in FIG. 6.

FIG. 7 illustrates a circuit diagram of the drive circuit of the power semiconductor switch according to a first specific example of the first exemplary embodiment of the present disclosure.

According to the first specific example of the first exemplary embodiment of the present disclosure as shown in FIG. 7, the first pulse source $V_1$ includes a first switch Q, a second switch $Q_2$, a third switch $Q_3$, and a fourth switch $Q_4$. Each switch includes a first terminal and a second terminal. The second terminal of the first switch $Q_1$ and the first terminal of the second switch $Q_2$ are electrically connected to the first terminal of the first pulse source $V_1$, i.e., a connection point between the second terminal of the first switch $Q_1$ and the first terminal of the second switch $Q_2$ is the first terminal of the first pulse source $V_1$.

The second terminal of the third switch $Q_3$ and the first terminal of the fourth switch $Q_4$ are electrically connected to the second terminal of the first pulse source $V_1$, i.e., a connection point between the second terminal of the third switch $Q_3$ and the first terminal of the fourth switch $Q_4$ is the second terminal of the first pulse source $V_1$. The first terminal of the first switch $Q_1$ and the first terminal of the third switch $Q_3$ are electrically connected to a working power supply $V_{CC}$, and the second terminal of the second switch $Q_2$ and the second terminal of the fourth switch $Q_4$ are grounded. The second pulse source $V_2$ is a winding, wherein a first terminal and a second terminal of the winding are respectively connected to the first terminal and the second terminal of the second pulse source $V_2$, i.e., the first terminal of the winding is the first terminal of the second pulse source $V_2$, and the second terminal of the winding is the second terminal of the second pulse source $V_2$.

According to an exemplary embodiment of the present disclosure, when the first terminal of the pulse modulation circuit 1 does not receive the fault signal F, the first switch $Q_1$ and the fourth switch $Q_4$ are turned on and the second switch $Q_2$ and the third switch $Q_3$ are turned off, and at this moment, the normally-closed switch SW is closed, such that the first pulse source $V_1$ outputs at least one first turn on pulse signal to drive the power semiconductor switch to be turned on. Alternatively, the first switch $Q_1$ and the fourth switch $Q_4$ are turned off and the second switch $Q_2$ and the third switch $Q_3$ are turned on, and at this moment, the normally-closed switch SW is closed, such that the first pulse source $V_1$ outputs at least one first turn off pulse signal to drive the power semiconductor switch to be turned off at a first speed. When the first terminal of the pulse modulation circuit 1 receives the fault signal F, the first switch $Q_1$ and the fourth switch $Q_4$ are turned off and the second switch $Q_2$ and the third switch $Q_3$ are turned on, and at this moment, the normally-closed switch SW is turned off, such that the first pulse source $V_1$ and the second pulse source $V_2$ jointly output at least one second turn off pulse signal to drive the power semiconductor switch to be turned off at a second speed. In this embodiment, the first switch $Q_1$, the second switch $Q_2$, the third switch $Q_3$, the fourth switch $Q_4$ and the normally-closed switch SW are controlled to be turned on or turned off by a controller (not shown in the figure).

In other words, when the first terminal of the pulse modulation circuit 1 does not receive the fault signal F, the normally-closed switch SW is closed, the winding is bypassed, the voltage amplitude of the first turn on pulse signal outputted from the first pulse source $V_1$ is +Vcc, and the voltage amplitude of the first turn off pulse signal outputted from the first pulse source $V_1$ is −Vcc. When the first terminal of the pulse modulation circuit 1 receives the fault signal F, the normally-closed switch SW is turned off, the winding is connected in series to the first pulse source such that the voltage amplitude of the second turn off pulse signal jointly outputted by the first pulse source $V_1$ and the winding is greater than −Vcc, i.e., the voltage amplitude of the second turn off pulse signal is smaller than the voltage amplitude Vcc of the first turn off pulse signal, with its pulse width unchanged. That is, the volt-second value of the second turn off pulse signal is reduced, and the second turn off pulse signal may make the power semiconductor switch be turned off slower. That is, the speed of the second turn off pulse signal driving the power semiconductor switch to be turned off is smaller than that of the first turn off pulse signal driving the power semiconductor switch to be turned off, i.e., a role of soft turn off is played.

According to an exemplary embodiment of the present disclosure as shown in FIG. 8, the drive circuit may further include drives 1-4 electrically connected to the control terminals of the switches $Q_1$-$Q_4$. The drives 1-4 and the normally-closed switch SW are connected to the controller (not shown in the figure). The control circuit respectively outputs a control signal to the corresponding drive and the normally-closed switch SW to control the switches $Q_1$-$Q_4$ and the normally-closed switch SW to be turned on or turned off. However, the present disclosure is not limited thereto, and other drive modes may be adopted.

FIG. 9 illustrates a circuit diagram of the drive circuit of the power semiconductor switch according to a second specific example of the first exemplary embodiment of the present disclosure.

According to the second specific example of the first exemplary embodiment of the present disclosure as shown in FIG. 9, the first pulse source $V_1$ includes a first capacitor $C_1$, a second capacitor $C_2$, a first switch $Q_1$, and a second switch $Q_2$. Each switch includes a first terminal and a second terminal, and each capacitor includes a first terminal and a second terminal. A second terminal of the first capacitor $C_1$ and a first terminal of the second capacitor $C_2$ are electrically connected to the first terminal of the first pulse source $V_1$, i.e., a connection point between the second terminal of the first capacitor $C_1$ and the first terminal of the second capacitor $C_2$ is the first terminal of the first pulse source A second terminal of the first switch $Q_1$ and a first terminal of the second switch $Q_2$ are electrically connected to the second terminal of the first pulse source $V_1$, i.e., a connection point between the second terminal of the first switch $Q_1$ and the first terminal of the second switch $Q_2$ is the second terminal of the first pulse source $V_1$. A first terminal of the first capacitor $C_1$ and a first terminal of the first switch $Q_1$ are electrically connected to a working power supply Vcc A second terminal of the second capacitor $C_2$ and a second terminal of the second switch $Q_2$ are grounded. The second pulse source $V_2$ is a winding, wherein a first terminal and a second terminal of the winding are respectively connected to the first terminal and the second terminal of the second pulse source $V_2$, i.e., the first terminal of the winding is the first terminal of the second pulse source $V_2$, and the second terminal of the winding is the second terminal of the second pulse source $V_2$.

According to an exemplary embodiment of the present disclosure, when the first terminal of the pulse modulation circuit 1 does not receive the fault signal F, the second switch $Q_2$ is turned on and the first switch $Q_1$ is turned off, and at this moment, the normally-closed switch SW is closed, such that the first pulse source $V_1$ outputs at least one first turn on pulse signal to drive the power semiconductor switch to be turned on; or the first switch $Q_1$ is turned on and the second switch $Q_2$ is turned off, and at this moment, the normally-closed switch SW is closed, such that the first pulse source $V_1$ outputs at least one first turn off pulse signal to drive the power semiconductor switch to be turned off When the first terminal of the pulse modulation circuit 1 receives the fault signal F, the normally-closed switch SW is turned off, and the first switch $Q_1$ is turned on and the second switch $Q_2$ is turned off, such that the first pulse source $V_1$ and the second pulse source $V_2$ jointly output at least one second turn off pulse signal.

The working principles and the technical effects in this exemplary embodiment are similar to those in the exemplary embodiment as shown in FIG. 7, but a topology used by a primary side of the isolation transformer is changed from the full-bridge topology to the half-bridge topology.

FIG. 10 illustrates a circuit diagram of the drive circuit of the power semiconductor switch according to a second exemplary embodiment of the present disclosure.

According to the second exemplary embodiment of the present disclosure as shown in FIG. 10, the pulse modulation circuit 1 includes a first switch $Q_1$, a second switch $Q_2$, a third switch $Q_3$, a fourth switch $Q_4$, a fifth switch $Q_5$, and a stabilivolt TVS. Each switch includes a first terminal and a second terminal. The second terminal of the first switch $Q_1$ and the first terminal of the second switch $Q_2$ are electrically connected to the second terminal of the pulse modulation circuit 1, i.e., a connection point between the second terminal of the first switch $Q_1$ and the first terminal of the second switch $Q_2$ is the second terminal of the pulse modulation circuit 1. The second terminal of the third switch $Q_3$ and the first terminal of the fourth switch $Q_4$ are electrically connected to the third terminal of the pulse modulation circuit, i.e., a connection point between the second terminal of the third switch $Q_3$ and the first terminal of the fourth switch $Q_4$ is the third terminal of the pulse modulation circuit. The first terminal of the first switch $Q_1$ and the first terminal of the third switch $Q_3$ are electrically connected to a working power supply Vcc. The second terminal of the second switch $Q_2$ and the second terminal of the fourth switch $Q_4$ are grounded. A control terminal of the second switch $Q_2$ is coupled to the first terminal of the pulse modulation circuit 1. A cathode of the stabilivolt TVS is connected to the second terminal of the first switch $Q_1$, an anode of the stabilivolt is connected to the first terminal of the fifth switch $Q_5$, and the second terminal of the fifth switch $Q_5$ is grounded. In this embodiment, the control terminals of the first switch to the fifth switch $Q_1$-$Q_5$ are connected to the controller (not shown in the figure) by means of their respectively corresponding drives, and control signals outputted from the controller respectively control the first switch to the fifth switch $Q_1$-$Q_5$ to be turned on or turned off According to an exemplary embodiment of the present disclosure, when the first terminal of the pulse modulation circuit 1 does not receive the fault signal F, the first switch $Q_1$ and the fourth switch $Q_4$ are turned on and the second switch $Q_2$, the third switch $Q_3$ and the fifth switch $Q_5$ are turned off, such that the pulse modulation circuit 1 outputs the at least one first turn on pulse signal to drive the power semiconductor switch to be turned on; or the first switch $Q_1$ and the fourth switch $Q_4$ are turned off and the second switch $Q_2$, the third switch $Q_3$ and the fifth switch $Q_5$ are turned on, such that the pulse modulation circuit 1 outputs the at least one first turn off pulse signal to drive the power semiconductor switch to be turned off. When the first terminal of the pulse modulation circuit 1 receives the fault signal F, the first switch $Q_1$, the second switch $Q_2$ and the fourth switch $Q_4$ are turned off and the third switch $Q_3$ and the fifth switch $Q_5$ are turned on, such that the pulse modulation circuit 1 outputs the at least one second turn off pulse signal to drive the power semiconductor switch to be turned off.

In other words, the fifth switch $Q_5$ is connected in series to the stabilivolt TVS and then is connected in parallel to the second switch $Q_2$. When the first terminal of the pulse modulation circuit 1 does not receive the fault signal F, the second switch $Q_2$ and the fifth switch $Q_5$ are simultaneously turned on. A branch of the fifth switch $Q_5$ is bypassed because the second switch $Q_2$ has a lower branch impedance. The pulse modulation circuit 1 outputs at least one first turn off pulse signal, i.e., the working power supply Vcc, the third switch $Q_3$ and the second switch $Q_2$ generate at least one first turn off pulse signal at two ends of a primary winding of the isolation transformer 2, wherein, the voltage amplitude of the first turn off pulse signal is Vcc. When the first terminal of the pulse modulation circuit 1 receives the fault signal F, the fault signal allows the drive corresponding to the second switch $Q_2$ to stop outputting the drive signal, such that the second switch $Q_2$ is turned off, whereas the fifth switch $Q_5$ is still turned on. The pulse modulation circuit 1 outputs at least one second turn off pulse signal, i.e., the working power supply Vcc, the third switch $Q_3$, the stabilivolt TVS (the voltage stabilization value of the stabilivolt may be selected as $V_Z$=Vcc/2) and the fifth switch $Q_5$ generate at least one second turn off pulse signal at two ends of the primary winding of the isolation transformer 2, wherein the voltage amplitude of a preset pulse width in the second turn off pulse signal is |Vcc−Vz|=Vcc/2. The voltage amplitude of second turn off pulse signal is smaller than that of the first turn off pulse signal, and a pulse width of the first turn off pulse signal is equal to that of the second turn off pulse signal, i.e., the volt-second value of the second turn off pulse signal is smaller than that of the first turn off pulse signal, such that the gate turn off speed of the power semiconductor switch becomes smaller, i.e., a role of soft turn off is played.

FIG. 11 illustrates a circuit diagram of the drive circuit of the power semiconductor switch according to a third exemplary embodiment of the present disclosure.

According to the third exemplary embodiment of the present disclosure as shown in FIG. 11, the pulse modulation circuit 1 includes a first capacitor $C_1$, a second capacitor $C_2$, a third capacitor $C_3$, a first switch a second switch $Q_2$, and a normally-closed switch SW. Each capacitor includes a first terminal and a second terminal, and each switch includes a first terminal and a second terminal. The second terminal of the first capacitor $C_1$ is electrically connected to the first terminal of the second capacitor $C_2$, the second terminal of the second capacitor $C_2$ and the first terminal of the third capacitor $C_3$ are electrically connected to the second terminal of the pulse modulation circuit 1, i.e., a connection point between the second terminal of the second capacitor $C_2$ and the first terminal of the third capacitor $C_3$ is the second terminal of the pulse modulation circuit 1. The second terminal of the first switch $Q_1$ and the first terminal of the second switch $Q_2$ are electrically connected to the third terminal of the pulse modulation circuit 1, i.e., a connection point between the second terminal of the first switch $Q_1$ and the first terminal of the second switch $Q_2$ is the third terminal of the pulse modulation circuit 1. The first terminal of the first capacitor $C_1$ and the first terminal of the first switch $Q_1$ are electrically connected to working power supplies (Vcc, Vcc1), the second terminal of the third capacitor $C_3$ and the second terminal of the second switch $Q_2$ are grounded, the normally-closed switch SW is connected in parallel to the first terminal and the second terminal of the first capacitor $C_1$, and a control terminal of the normally-closed switch SW is connected to the first terminal of the pulse modulation circuit 1, i.e., the control terminal of the normally-closed switch SW is the first terminal of the pulse modulation circuit 1.

According to an exemplary embodiment of the present disclosure, when the first terminal of the pulse modulation circuit 1 does not receive the fault signal F, the second switch $Q_2$ is turned on and the first switch $Q_1$ is turned off, and at this moment, the normally-closed switch SW is closed, such that the pulse modulation circuit 1 outputs the at least one first turn on pulse signal to drive the power semiconductor switch to be turned on. Alternatively, the second switch $Q_2$ is turned off and the first switch $Q_1$ is turned on, and at this moment, the normally-closed switch SW is closed, such that the pulse modulation circuit 1 outputs the at least one first turn off pulse signal to drive the power semiconductor switch to be turned off. When the first terminal of the pulse modulation circuit 1 receives the fault signal F, the normally-closed switch SW is turned off, the first switch $Q_1$ is turned on whereas the second switch $Q_2$ is turned off, such that the pulse modulation circuit 1 outputs the at least one second turn off pulse signal to drive the power semiconductor switch to be turned off.

In other words, when the first terminal of the pulse modulation circuit 1 does not receive the fault signal F, the normally-closed switch SW is closed, the first capacitor $C_1$ is bypassed, and Vcc1=Vcc. The pulse modulation circuit 1 outputs at least one first turn off pulse signal, i.e., the working power supply Vcc, the first switch $Q_1$, the second capacitor $C_2$ and the third capacitor $C_3$ generate at least one first turn off pulse signal at two ends of a primary winding of the isolation transformer 2, wherein, the voltage amplitude of the first turn off pulse signal is Vcc/2. When the first terminal of the pulse modulation circuit 1 receives the fault signal F, the normally-closed switch SW is turned off, the first capacitor $C_1$ is connected in series to a circuit, such that the pulse modulation circuit 1 outputs at least one second turn off pulse signal, i.e., the working power supply Vcc, the first switch $Q_1$, the first capacitor $C_1$, the second capacitor $C_2$ and the third capacitor $C_3$ generate at least one second turn off pulse signal at two ends of the primary winding of the isolation transformer 2, wherein the voltage across the first terminal of the second capacitor $C_2$ and an earthing contact is Vcc1, wherein Vcc1<Vcc, and the voltage amplitude of the second turn off pulse signal is smaller than Vcc/2. As can be seen, the voltage amplitude of a preset pulse width in the second turn off pulse signal is smaller than that of the first turn off pulse signal, and a pulse width of the first turn off pulse signal is equal to that of the second turn off pulse signal, i.e., the volt-second value of the second turn off pulse signal is smaller than that of the first turn off pulse signal, such that the turn off speed of the power semiconductor switch becomes smaller, i.e., a role of soft turn off is played.

FIG. 12 illustrates a circuit diagram of the drive circuit of the power semiconductor switch according to a modified example of the first exemplary embodiment of the present disclosure.

For the drive circuit of the power semiconductor switch according to a modified example of the first exemplary embodiment of the present disclosure as shown in FIG. 12, the pulse modulation circuit 1 further includes a time control unit. The time control unit is coupled between the first terminal of the pulse modulation circuit 1 and the control terminal of the normally-closed switch SW, and the time control unit is configured to control, based on the fault signal F received by the pulse modulation circuit 1, the normally-closed switch SW to turn off within preset time period. By sequentially processing the fault signal F and then controlling the normally-closed switch SW to be turned off, the volt-second value of the second turn off pulse signal at the moment of soft turn off may be flexibly adjusted, and then the gate voltage drop speed may be adjusted to regulate the soft turn off effect.

However, the present disclosure is not limited thereto, in addition to the first exemplary embodiment of the present disclosure, as shown in FIG. 13 and. FIG. 14, the time control unit also may be applied to the second exemplary embodiment and the third exemplary embodiment, and similar technical effects may be achieved.

Figure 15A:
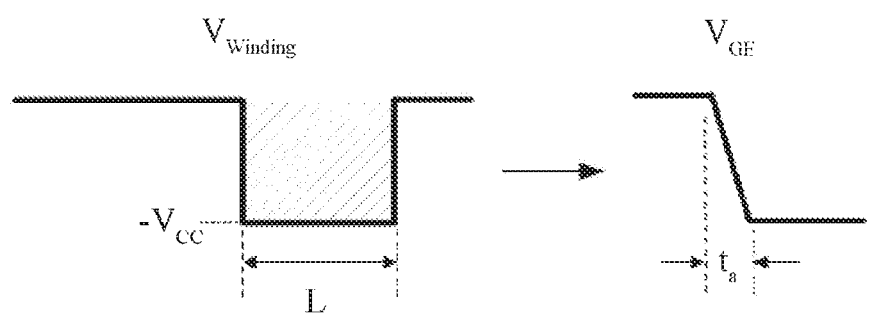
FIG. 15a-FIG 15d illustrate waveform diagrams of the drive circuit of the power semiconductor switch according to a modified example of the first exemplary embodiment of the present disclosure.
Figure 15B:
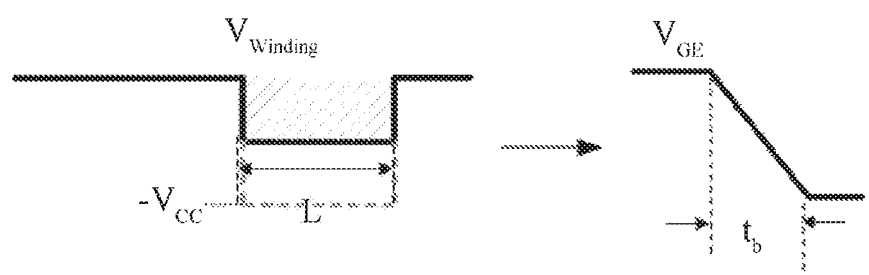
Figure 15C:
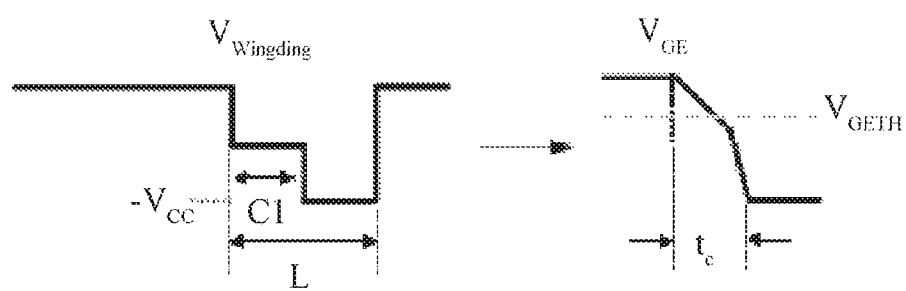
Figure 15D:
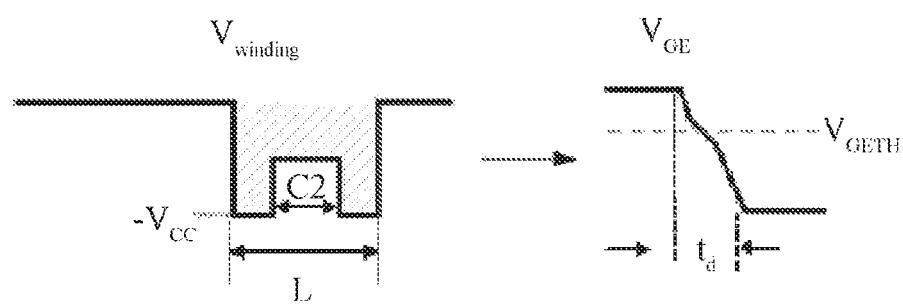

As shown in FIG. 15a-FIG 15d, FIG. 15a is a waveform diagram of the first turn off pulse signal outputted from the pulse modulation circuit 1 and the voltage across the gate and the emitter of the power semiconductor switch. As shown in FIG. 15a, the voltage amplitude of the first turn off pulse signal is Vcc, and the time required when the voltage $V_{GE}$ across the gate and the emitter of the power semiconductor switch drops from a high voltage to a low voltage is $t_a$. FIG. 15b-FIG 15d are waveform diagrams of the second turn off pulse signal outputted from the pulse modulation circuit 1 and the voltage across the gate and the emitter of the power semiconductor switch in the case that the time control unit controls, when the first terminal of the pulse modulation circuit 1 receives the fault signal F, the normally-closed switch SW or the second switch $Q_2$ to be turned off within preset time period. As shown in FIG. 15b, when the first terminal of the pulse modulation circuit 1 receives the fault signal F, the time control unit controls the normally-closed switch SW or the second switch $Q_2$ to be turned off within the preset time period, the voltage amplitude of the second turn off pulse signal outputted from the pulse modulation circuit 1 is smaller than Vcc, and the time required when the voltage $V_{GE}$ across the gate and the emitter of the power semiconductor switch drops from a high voltage to a low voltage (smaller than the drive voltage $V_{GETH}$ of the gate of the power semiconductor switch) is $t_b$ ($t_b<t_a$). The pulse width L of the second turn off pulse signal is equal to that of the first turn off pulse signal, and the preset time period is equal to the pulse width L of the second turn off pulse signal. As shown in FIG. 15c, when the first terminal of the pulse modulation circuit 1 receives the fault signal F, the time control unit controls the normally-closed switch SW or the second switch $Q_2$ to be turned off within the preset time period, next the normally-closed switch SW or the second switch $Q_2$ is turned on, the voltage amplitude of a preset pulse width $C_1$ of the second turn off pulse signal outputted from the pulse modulation circuit 1 is smaller than Vcc, and the time required when the voltage $V_{GE}$ across the gate and the emitter of the power semiconductor switch drops from a high voltage to a low voltage (smaller than the drive voltage $V_{GETH}$ of the gate of the power semiconductor switch) is $t_c$ ($t_c<t_a$). The preset time period falls within a first part of the second turn off pulse signal, and the preset time period is equal to the preset pulse width C1 of the second turn off pulse signal and is less than the pulse width L of the second turn off pulse signal. As shown in FIG. 15d, when the first terminal of the pulse modulation circuit 1 receives the fault signal F, the normally-closed switch SW or the second switch $Q_2$ is first in an turned on state, then the time control unit controls the normally-closed switch SW or the second switch $Q_2$ to be turned off within the preset time period, next the normally-closed switch SW or the second switch $Q_2$ is turned on again, the voltage amplitude of a preset pulse width $C_2$ of the second turn off pulse signal outputted from the pulse modulation circuit 1 is smaller than Vcc, and the time required when the voltage $V_{GE}$ across the gate and a first electrode of the power semiconductor switch drops from a high voltage to a low voltage (smaller than the drive voltage $V_{GETH}$ of the gate of the power semiconductor switch) is $t_d$ ($t_d<t_a$). The preset time period falls within a middle part of the second turn off pulse signal, and the preset time period is equal to the preset pulse width $C_2$ of the second turn off pulse signal and is less than the pulse width L of the second turn off pulse signal.

As shown in FIG. 15b-FIG. 15d, the time $t_b$, $t_c$ and $t_d$ required when the voltage $V_{GE}$ across the gate and the first electrode of the power semiconductor switch drops from a high voltage to a low voltage are smaller than $t_a$. As can be seen, the second turn off pulse signal allows the turn off speed of the power semiconductor switch to become smaller, and thus can achieve a soft turn off effect.

In conclusion, by means of a simple circuit structure, the drive circuit of the power semiconductor switch according to the exemplary embodiments of the present disclosure solves a problem that a simple drive is not suitable to apply in traditional soft turn off circuit and active clamping circuit. Therefore, voltage spike triggered by large current when the IGBT is turned off in the event of overcurrent/short-circuit fault may be effectively reduced, and reliability and scope of application of the simple drive may be greatly enhanced.

Through the above detailed description, those skilled in the art readily understand that the drive circuit of the power semiconductor switch according to the exemplary embodiments of the present disclosure have one or more of the following advantages.

According to some embodiments of the present disclosure, by means of a simple circuit structure, the drive circuit of the power semiconductor switch solves the problem that a simple drive is not suitable to apply in traditional soft turn off circuit and active clamping circuit. Therefore, voltage spike triggered by large current when the IGBT is turned off in the event of overcurrent/short-circuit fault may be effectively reduced, and reliability and scope of application of the simple drive may be greatly enhanced.

According to some embodiments of the present disclosure, the drive circuit of the power semiconductor switch of the present disclosure is simple in structure, low in cost, and high in reliability.

According to some embodiments of the present disclosure, by sequentially processing the fault signal F and then controlling the normally-closed switch SW or the second switch $Q_2$ the volt-second value of the second turn off pulse signal at the moment of soft turn off may be flexibly adjusted, and then the gate voltage drop speed may be adjusted to achieve different soft turn off effects.

Other embodiments of the present disclosure will be apparent to those skilled in the art from consideration of the specification and practice of the present disclosure disclosed here. The present disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A drive circuit of a power semiconductor switch, comprising:

a pulse modulation circuit, provided with a first terminal, a second terminal and a third terminal, the first terminal being configured to receive a fault signal;

an isolation transformer, provided with a first primary terminal, a second primary terminal, a first secondary terminal, and a second secondary terminal; the first primary terminal being coupled to the second terminal of the pulse modulation circuit, and the second primary terminal being coupled to the third terminal of the pulse modulation circuit; and a pulse demodulation circuit, provided with a first input terminal, a second input terminal, a first output terminal, and a second output terminal; the first input terminal being coupled to the first secondary terminal, the second input terminal being coupled to the second secondary terminal, the first output terminal being connected to a gate of the power semiconductor switch, and the second output terminal being connected to an emitter of the power semiconductor switch;

wherein when there is no fault signal being received at the first terminal of the pulse modulation circuit, the pulse modulation circuit outputs at least one first turn on pulse signal and at least one first turn off pulse signal to the isolation transformer based on a pulse width modulation signal, and transmits the at least one first turn on pulse signal and the at least one first turn off pulse signal to the pulse demodulation circuit via the isolation transformer, the at least one first turn on pulse signal and the at least one first turn off pulse signal are, via the demodulation circuit, used for charging-discharging of a gate capacitor of the power semiconductor switch, driving the power semiconductor switch to be turned on, and turned off at a first speed; and when the fault signal is received at the first terminal of the pulse modulation circuit, the pulse modulation circuit outputs at least one second turn off pulse signal to the isolation transformer based on the fault signal, and transmits the at least one second turn off pulse signal to the pulse demodulation circuit via the isolation transformer, the at least one second turn off pulse signal is, via the demodulation circuit, used for discharging of the gate capacitor of the power semiconductor switch, driving the power semiconductor switch to be turned off at a second speed; wherein a voltage amplitude of a preset pulse width in the second turn off pulse signal is smaller h a voltage amplitude of the first turn off pulse signal, and a pulse width of the second turn off pulse signal is equal to a pulse width of the first turn off pulse signal, causing the second speed to be smaller than the first speed.

2. The drive circuit according to claim 1, wherein the pulse modulation circuit comprises a first pulse source provided with a first terminal and a second terminal, a second pulse source provided with a first terminal and a second terminal, and a normally-closed switch; the normally-closed switch is connected in parallel to the first terminal and the second terminal of the second pulse source, a control terminal of the normally-closed switch is coupled to the first terminal of the pulse modulation circuit, the first terminal of the second pulse source is connected to the first terminal of the first pulse source, the second terminal of the second pulse source is connected to the second terminal of the pulse modulation circuit, and the second terminal of the first pulse source is connected to the third terminal of the pulse modulation circuit.

3. The drive circuit according to claim 2, wherein the first pulse source comprises a first switch, a second switch, a third switch, and a fourth switch, each switch being provided with a first terminal and a second terminal, the second terminal of the first switch and the first terminal of the second switch are electrically connected to the first terminal of the first pulse source, the second terminal of the third switch and the first terminal of the fourth switch are electrically connected to the second terminal of the first pulse source, the first terminal of the first switch and the first terminal of the third switch are electrically connected to a working power supply, and the second terminal of the second switch and the second terminal of the fourth switch are grounded; and the second pulse source comprises a winding, wherein a first terminal and a second terminal of the winding are respectively connected to the first terminal and the second terminal of the second pulse source.

4. The drive circuit according to claim 3, wherein when there is no fault signal being received at the first terminal of the pulse modulation circuit, the normally-closed switch is closed, the first switch and the fourth switch are turned on and the second switch and the third switch are turned off, causing the first pulse source to output the at least one first turn on pulse signal; and the first switch and the fourth switch are turned off and the second switch and the third switch are turned on, causing the first pulse source to output the at least one first turn off pulse signal; and when the fault signal is received at the first terminal of the pulse modulation circuit, the normally-closed switch is opened, the first switch and the fourth switch are turned off and the second switch and the third switch are turned on, causing the first pulse source and the second pulse source to jointly output the at least one second turn off pulse signal.

5. The drive circuit according to claim 2, wherein the first pulse source comprises a first capacitor, a second capacitor, a first switch, and a second switch; a second terminal of the first capacitor and a first terminal of the second capacitor are electrically connected to the first terminal of the first pulse source, a second terminal of the first switch and a first terminal of the second switch are electrically connected to the second terminal of the first pulse source, a first terminal of the first capacitor and a first terminal of the first switch are electrically connected to a working power supply, and a second terminal of the second capacitor and a second terminal of the second switch are grounded; and the second pulse source comprises a winding, wherein a first terminal and a second terminal of the winding are respectively connected to the first terminal and the second terminal of the second pulse source.

6. The drive circuit according to claim 5, wherein when there is no fault signal being received at the first terminal of the pulse modulation circuit, the normally-closed switch is closed, the second switch is turned on and the first switch is turned off, causing the first pulse source to output the at least one first turn on pulse signal; and the first switch is turned on and the second switch is turned off, causing the first pulse source to output the at least one first turn off pulse signal; and when the fault signal is received at the first terminal of the pulse modulation circuit, the normally-closed switch is opened, the first switch is turned on and the second switch is turned off, causing the first pulse source and the second pulse source to jointly output the at least one second turn off pulse signal.

7. The drive circuit according to claim , wherein the pulse modulation circuit comprises a first switch, a second switch, a third switch, a fourth switch, a fifth switch, and a stabilivolt; each switch being provided with a first terminal and a second terminal, the second terminal of the first switch and the first terminal of the second switch are electrically connected to the second terminal of the pulse modulation circuit, the second terminal of the third switch and the first terminal of the fourth switch are electrically connected to the third terminal of the pulse modulation circuit, the first terminal of the first switch and the first terminal of the third switch are electrically connected to a working power supply, the second terminal of the second switch and the second terminal of the fourth switch are grounded, and a control terminal of the second switch is coupled to the first terminal of the pulse modulation circuit; and a cathode of the stabilivolt is connected to the second terminal of the first switch, an anode of the stabilivolt is connected to the first terminal of the fifth switch, and the second terminal of the fifth switch is grounded.

8. The drive circuit according to claim 7, wherein when there is no fault signal being received at the first terminal of the pulse modulation circuit, the first switch and the fourth switch are turned on and the second switch, the third switch and the fifth switch are turned off, causing the pulse modulation circuit to output the at least one first turn on pulse signal; and the first switch and the fourth switch are turned off and the second switch, the third switch and the fifth switch are turned on, causing the pulse modulation circuit to output the at least one first turn off pulse signal; and when the fault signal is received at the first terminal of the pulse modulation circuit, the first switch, the second switch and the fourth switch are turned off and the third switch and the fifth switch are turned on, causing the pulse modulation circuit to output the at least one second turn off pulse signal.

9. The drive circuit according to claim , wherein the pulse modulation circuit comprises a first capacitor, a second capacitor, a third capacitor, a first switch, a second switch, and a normally-closed switch; a second terminal of the first capacitor is electrically connected to a first terminal of the second capacitor, a second terminal of the second capacitor and a first terminal of the third capacitor are electrically connected to the second terminal of the pulse modulation circuit, a second terminal of the first switch and a first terminal of the second switch are electrically connected to the third terminal of the pulse modulation circuit, a first terminal of the first capacitor and a first terminal of the first switch are electrically connected to a working power supply, a second terminal of the third capacitor and a second terminal of the second switch are grounded, the normally-closed switch is connected in parallel to the first terminal and the second terminal of the first capacitor, and a control terminal of the normally-closed switch is coupled to the first terminal of the pulse modulation circuit.

10. The drive circuit according to claim 9, wherein when there is no fault signal being received at the first terminal of the pulse modulation circuit, the normally-closed switch is closed, the second switch is turned on and the first switch is turned off, causing the pulse modulation circuit to output the at least one first turn on pulse signal; or the second switch is turned off and the first switch is turned on, such that the pulse modulation circuit outputs the at least one first turn off pulse signal; and when the fault signal is received at the first terminal of the pulse modulation circuit, the normally-closed switch is turned off, and the first switch is turned on and the second switch is turned off, causing the pulse modulation circuit to output the at least one second turn off pulse signal.

11. The drive circuit according to claim 2, wherein the pulse modulation circuit further comprises a time control unit, the time control unit is coupled between the control terminal of the normally-closed switch and the first terminal of the pulse modulation circuit, and the time control unit is configured to control, based on the fault signal received at the first terminal of the pulse modulation circuit, the normally-closed switch to be turned off within a preset time period.

12. The drive circuit according to claim 7, wherein the pulse modulation circuit further comprises a time control unit, the time control unit is coupled between the control terminal of the second switch and the first terminal of the pulse modulation circuit, and the time control unit is configured to control, based on the fault signal received at the first terminal of the pulse modulation circuit, the second switch to be turned off within a preset time period.

13. The drive circuit according to claim 9, wherein the pulse modulation circuit further comprises a time control unit, the time control unit is coupled between the control terminal of the normally-closed switch and the first terminal of the pulse modulation circuit, and the time control unit is configured to control, based on the fault signal received at the first terminal of the pulse modulation circuit, the normally-closed switch to be turned off within a preset time period.

14. The drive circuit according to claim 11, wherein the preset time period satisfies any one of following conditions:
the preset time period is a pulse width of the second turn off pulse signal;
the preset time period is less than a pulse width of the second turn off pulse signal and falls with a first part of the second turn off pulse signal;
the preset time period is less than a pulse width of the second turn off pulse signal and falls within a middle park of the second turn off pulse signal; and
the preset time period is equal to the preset pulse width.

15. The drive circuit according to claim 12, wherein the preset rime period satisfies any one of following conditions:
the preset time period is a pulse width of the second turn off pulse signal;
the preset time period is less than a pulse width of the second turn off pulse signal and falls within a first part of the second turn off pulse signal;
the preset time period is less than a pulse width of the second turn off pulse signal and falls within a middle part of the second turn off pulse signal; and
the preset time period is equal to the preset pulse width.

16. The drive circuit according to claim 13, wherein the preset time period satisfies any one of following conditions:
the preset time period is a pulse width of the second turn off pulse signal;
the preset time period is less than a pulse width of the second turn off pulse signal and falls within a first part of the second turn off pulse signal;
the preset time period is less than a pulse width of the second turn off pulse signal and falls within a middle part of the second turn off pulse signal; and
the preset time period is equal to the preset pulse width.

17. The drive circuit according to claim 1, wherein each of the first turn on pulse signal, the first turn off pulse signal and the second turn off pulse signal comprise an energy pulse signal and a drive pulse signal.

* * * * *